(12) United States Patent
Lin

(10) Patent No.: US 10,461,069 B2
(45) Date of Patent: Oct. 29, 2019

(54) HYBRID BONDING WITH THROUGH SUBSTRATE VIA (TSV)

(71) Applicant: TAIWAN SEMICONDUCTOR MANUFACTURING CO., LTD., Hsinchu (TW)

(72) Inventor: Jing-Cheng Lin, Zhudong Township, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/997,156

(22) Filed: Jun. 4, 2018

(65) Prior Publication Data
US 2018/0286846 A1 Oct. 4, 2018

Related U.S. Application Data

(62) Division of application No. 14/752,342, filed on Jun. 26, 2015, now Pat. No. 9,991,244, which is a division
(Continued)

(51) Int. Cl.
*H01L 23/00* (2006.01)
*H01L 25/00* (2006.01)
(Continued)

(52) U.S. Cl.
CPC ........ *H01L 25/50* (2013.01); *H01L 21/76895* (2013.01); *H01L 21/76897* (2013.01); *H01L 21/76898* (2013.01); *H01L 23/481* (2013.01);

*H01L 24/89* (2013.01); *H01L 25/0657* (2013.01); *H01L 2224/0231* (2013.01); *H01L 2224/05547* (2013.01);
(Continued)

(58) Field of Classification Search
CPC ............. H01L 23/481; H01L 23/49827; H01L 23/5226; H01L 24/01; H01L 24/26; H01L 25/043; H01L 25/0652; H01L 25/0657; H01L 25/071; H01L 25/074; H01L 25/0756; H01L 25/117; H01L 25/50
See application file for complete search history.

(56) References Cited

U.S. PATENT DOCUMENTS 5,270,261 A  12/1993  Bertin et al.
5,547,906 A   8/1996  Badehi
(Continued)

OTHER PUBLICATIONS

US Notice of Allowance for U.S. Appl. No. 15/076,141, dated Jul. 27, 2017.
(Continued)

*Primary Examiner* — Cuong Q Nguyen
(74) *Attorney, Agent, or Firm* — Birch, Stewart, Kolasch & Birch, LLP

(57) ABSTRACT

A semiconductor device structure is provided. The semiconductor device structure includes a bonding structure formed between a first substrate and a second substrate. The bonding structure includes a first polymer bonded to a second polymer, and a first conductive material bonded to a second conductive material. The semiconductor device includes a first TSV formed in the first substrate and an interconnect structure formed over the first TSV. The first TSV is between the interconnect structure and the bonding structure.

20 Claims, 8 Drawing Sheets

Related U.S. Application Data of application No. 13/943,224, filed on Jul. 16, 2013, now Pat. No. 9,087,821.

(51) Int. Cl.
*H01L 23/48* (2006.01)
*H01L 21/768* (2006.01)
*H01L 25/065* (2006.01)

(52) U.S. Cl.
CPC .............. *H01L 2224/08145* (2013.01); *H01L 2224/80815* (2013.01); *H01L 2224/80895* (2013.01); *H01L 2224/80896* (2013.01); *H01L 2225/06513* (2013.01); *H01L 2225/06527* (2013.01); *H01L 2225/06541* (2013.01); *H01L 2225/06558* (2013.01); *H01L 2924/0002* (2013.01); *H01L 2924/1304* (2013.01)

(56) References Cited

U.S. PATENT DOCUMENTS

| | | |
|---|---|---|
| 5,753,536 A | 5/1998 | Sugiyama et al. |
| 5,952,725 A | 9/1999 | Ball |
| 6,448,661 B1 | 9/2002 | Kim et al. |
| 7,354,798 B2 | 4/2008 | Pogge et al. |
| 7,791,175 B2 | 9/2010 | Pyeon |
| 7,825,024 B2 | 11/2010 | Lin et al. |
| 7,898,095 B2 | 3/2011 | Patti et al. |
| 7,906,363 B2 | 3/2011 | Koyanagi |
| 7,943,428 B2 | 5/2011 | Gambino et al. |
| 8,421,193 B2 | 4/2013 | Huang |
| 8,563,403 B1 | 10/2013 | Farooq et al. |
| 8,729,711 B2 | 5/2014 | Nishio |
| 8,841,777 B2 | 9/2014 | Farooq et al. |
| 8,860,229 B1 | 10/2014 | Lin |
| 8,993,380 B2 | 3/2015 | Hou et al. |
| 9,087,821 B2 | 7/2015 | Lin |
| 9,281,254 B2 | 3/2016 | Yu et al. |
| 9,293,437 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2007/0269978 A1 | 11/2007 | Shih et al. |
| 2009/0315154 A1 | 12/2009 | Kirby et al. |
| 2010/0047963 A1* | 2/2010 | Wang .................... H01L 23/481 438/107 |
| 2010/0096760 A1 | 4/2010 | Yu et al. |
| 2010/0178761 A1 | 7/2010 | Chen et al. |
| 2011/0050320 A1 | 3/2011 | Gillingham |
| 2011/0101537 A1 | 5/2011 | Barth et al. |
| 2011/0108972 A1 | 5/2011 | Foster, Sr. et al. |
| 2011/0193240 A1 | 8/2011 | Farooq et al. |
| 2011/0248396 A1* | 10/2011 | Liu ..................... H01L 25/0657 257/686 |
| 2011/0248403 A1* | 10/2011 | Chandrasekaran .......................... H01L 25/0657 257/770 |
| 2012/0018885 A1 | 1/2012 | Lee et al. |
| 2012/0193785 A1 | 8/2012 | Lin et al. |
| 2012/0292784 A1 | 11/2012 | Nishio |
| 2013/0020468 A1 | 1/2013 | Mitsuhashi et al. |
| 2013/0020719 A1 | 1/2013 | Jung et al. |
| 2013/0122672 A1 | 5/2013 | Or-Bach et al. |
| 2013/0169355 A1 | 7/2013 | Chen et al. |
| 2013/0193550 A1 | 8/2013 | Sklenard et al. |
| 2013/0252399 A1* | 9/2013 | Leduc .................. H01L 23/293 438/455 |
| 2013/0270328 A1* | 10/2013 | Di Cioccio ............. H01L 25/50 228/176 |
| 2014/0117546 A1 | 5/2014 | Liu et al. |
| 2014/0151895 A1 | 6/2014 | West et al. |
| 2014/0264840 A1 | 9/2014 | Lin et al. |
| 2014/0353828 A1 | 12/2014 | Edelstein et al. |
| 2015/0145144 A1 | 5/2015 | McDonald |

OTHER PUBLICATIONS

U.S. Office Action, dated Oct. 22, 2018, for U.S. Appl. No. 15/705,894.

U.S Notice of Allowance, dated May 1, 2019, for U.S. Appl. No. 15/705,894.

U.S. Office Action, dated Apr. 16, 2019, for U.S. Appl. No. 15/801,935.

U.S. Office Action, dated Feb. 25, 2019, for U.S. Appl. No. 15/801,935.

\* cited by examiner

HYBRID BONDING WITH THROUGH SUBSTRATE VIA (TSV)

CROSS REFERENCE TO RELATED APPLICATIONS

This application is related to the following co-pending a commonly assigned patent applications: U.S. Ser. No. 13/943,157, filed on Jul. 16, 2013 and entitled "Front-to-back bonding with through-substrate via (TSV)", and U.S. Ser. No. 13/943,245, filed on Jul. 16, 2013 and entitled "Mechanisms for forming three-dimensional integrated circuit (3DIC) stacking structure", and U.S. Ser. No. 13/943,401, filed on Jul. 16, 2013 and entitled "Hybrid bonding with through substrate via (TSV)", and U.S. Ser. No. 14/488,017, filed on Sep. 16, 2014 and entitled "Hybrid bonding with through substrate via (TSV)", and U.S. Ser. No. 15/705,894, filed on Sep. 15, 2017 and entitled "Method for forming hybrid bonding with through substrate via (TSV)", the entire of which is incorporated by reference herein.

This application is a Divisional application of U.S. patent application Ser. No. 14/752,342, filed on Jun. 26, 2015, which is a Divisional application of U.S. patent application Ser. No. 13/943,224, filed on Jul. 16, 2013, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, as examples. However, there are many challenges related to 3DICs.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Figure 1A:
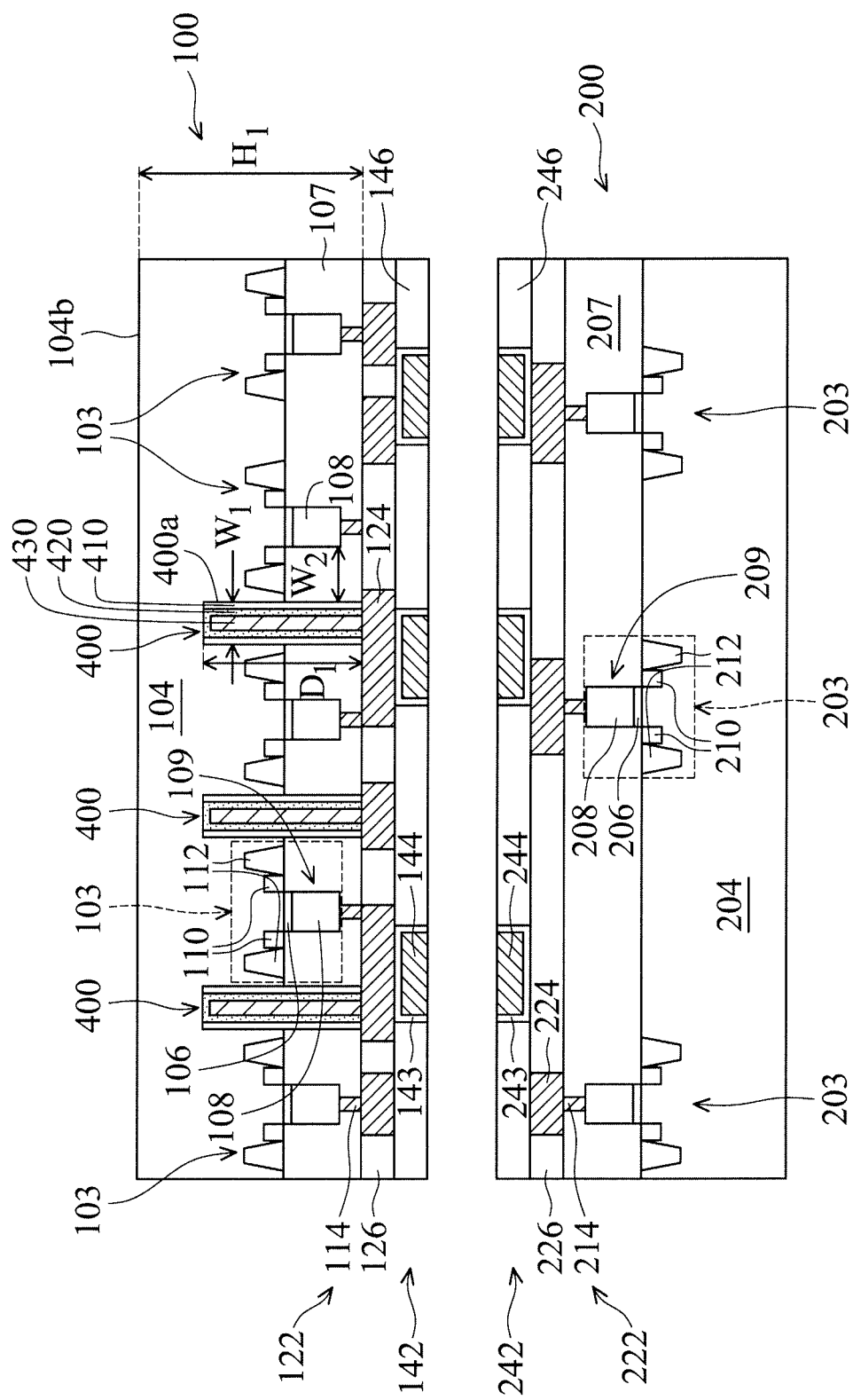
FIGS. 1A-1D show cross-sectional representations of various stages of forming a semiconductor device, in accordance with some embodiments of the disclosure.

FIGS. 1A-1D show cross-sectional representations of various stages of forming semiconductor devices in accordance with some embodiments. Referring to FIG. 1A, a cross-sectional representation of a portion of semiconductor wafer 100 and a portion of semiconductor wafer 200 are shown in accordance with some embodiments.

Semiconductor wafer 100 includes a semiconductor substrate 104, which may be made of silicon or other semiconductor materials. Alternatively or additionally, semiconductor substrate 104 may include other elementary semiconductor materials such as germanium. In some embodiments, semiconductor substrate 104 is made of a compound semiconductor such as silicon carbide, gallium arsenic, indium arsenide, or indium phosphide. In some embodiments, semiconductor substrate 104 is made of an alloy semiconductor such as silicon germanium, silicon germanium carbide, gallium arsenic phosphide, or gallium indium phosphide. In some embodiments, semiconductor substrate 104 includes an epitaxial layer. For example, semiconductor substrate 104 has an epitaxial layer overlying a bulk semiconductor.

Referring to FIG. 1A, device regions 103 are formed in semiconductor wafer 100 in a front-end-of-line (FEOL) process in some embodiments. Each device regions 103 includes a gate structure 109 embedded in a dielectric layer 107, source/drain regions 110, and isolation structures 112, such as shallow trench isolation (STI) structures. Gate structure 109 includes a gate dielectric layer 106, a gate electrode 108, and possibly spacers (not shown). Device regions 103 shown in FIG. 1A are merely examples, and other structures may be formed in device regions 103.

Device regions 103 may form various N-type metal-oxide semiconductor (NMOS) and/or P-type metal-oxide semiconductor (PMOS) devices, such as transistors or memories, and the like, which are interconnected to perform one or more functions. Other devices, such as capacitors, resistors, diodes, photo-diodes, fuses, and the like may also be formed on substrate 104.

As shown in FIG. 1A, through-substrate vias (TSVs) 400 are formed between two adjacent device regions 103. TSVs 400 extend into substrate 104. TSVs 400 are used to provide electrical connections and for heat dissipation for 3DICs. Although FIG. 1A shows four TSVs, the number of TSVs may be adjusted according to actual application.

Each TSVs 400 includes a liner 410, a diffusion barrier layer 420, and a conductive material 430 in accordance with some embodiments. Liner 410 is made of an insulating material, such as oxides or nitrides. Liner 410 may be formed by using a plasma enhanced chemical vapor deposition (PECVD) process or other applicable processes. Liner 410 may be a single layer or multi-layers. In some embodiments, liner 410 has a thickness in a range from about 100 Å to about 5000 Å.

Diffusion Barrier layer 420 is made of Ta, TaN, Ti, TiN, or CoW. In some embodiments, diffusion barrier layer 420 is formed by a physically vapor deposition (PVD) process. Conductive material 430 is made of copper (Cu), copper alloy, aluminum (Al), aluminum alloys, or combinations thereof. Alternatively, other applicable materials may be used. In some embodiments, conductive material 430 is formed by plating.

With high aspect ratio, filling materials into the TSV opening becomes challenging. Voids may form in a TSV opening. In addition, due to insufficient sidewall coverage of liner 410 or diffusion barrier layer 420, some extrusion or diffusion problems related to conductive via material 430 may occur. In contrast, as shown in FIG. 1A, TSVs 400 are designed to have a smaller depth $D_1$ than height $H_1$ of semiconductor wafer 100. Therefore, the void problems and the extrusion or diffusion problems related to the conductive material 430 are resolved or greatly reduced.

In addition, width $W_1$ of TSVs 400 is reduced along with a decrease of depth $D_1$ of TSVs 400. When distance $W_2$ is smaller, a larger area of device regions 103 may be used. As a result, integrated intensity of the devices in device regions 103 is further improved.

In some embodiments, semiconductor wafer 100 has a height $H_1$ from a bottom surface 104b of semiconductor substrate 104 to a top surface of gate structure 109 in a range from about 1 µm to about 20 µm. In some embodiments, TSVs 400 have a width $W_1$ in a range from about 0.025 µm to about 2 µm. In some embodiments, TSVs 400 have a depth $D_1$ in a range from about 0.2 µm to about 10 µm. In some embodiments, TSVs 400 have an aspect ratio ($D_1/W_1$) in a range from about 2 to about 15.

In addition, devices in the vicinity of the TSV suffer from serious performance degradation due to the stress induced by the TSV. A keep-out zone (KOZ) is used to define a region where no devices could be placed within. In some embodiments, keep-out zone (KOZ) is defined by a distance $W_2$, which is measured from a sidewall 400a of TSV 400 to a nearest gate structure 209. Since the depth $D_1$ of TSVs 400 is made smaller, a smaller width $W_1$ is achieved. Therefore, overall stress induced by TSVs 400 is reduced. In some embodiments, distance $W_2$ is in a range from 0.01 µm to about 3 In some embodiments, when width $W_1$ of TSVs 400 is reduced to a range from about 2 µm to about 3 µm, the stress induced by TSV can almost be ignored.

As shown in FIG. 1A, a metallization structure 122 is formed over TSVs 400 and device regions 103 to individually connect to TSVs 400 and device regions 103. In some embodiments, metallization structure 122 includes interconnect structure, such as contact plugs 114 and conductive features 124. Conductive features 124 are embedded in an insulating material 126. In some embodiments, insulating material 126 is made of silicon oxide. In some embodiments, insulating material 126 includes multiple dielectric layers of dielectric materials. Metallization structure 122 shown is merely for illustrative purposes. Metallization structure 122 may include other configurations and may include one or more conductive lines and via layers.

A bonding structure 142 is formed over metallization structure 122. Bonding structure 142 includes a conductive material 144 embedded in a polymer material 146. Conductive material 144 is contact pad (or bond pad) formed on a top surface of semiconductor wafer 100. Conductive features 124 are connected to conductive material 144. Conductive material 144 may be made of conductive materials, such as copper (Cu), copper alloy, aluminum (Al), aluminum alloy, or combinations thereof. Other applicable materials may be used as conductive material 144.

In some embodiments, if conductive material 144 is made of a metal, such as copper, which is easy to diffuse, a diffusion barrier layer 143 is needed. Diffusion barrier layer 143 may be made of silicon nitride (SiN), silicon oxynitride (SiON), titanium nitride (TiN), tantalum nitride (TaN), or aluminum nitride (AlN). In some embodiments, conductive material 144 is made of copper, and diffusion barrier layer 143 is made of Ti, TiN, Ta, TaN, Ta/TaN, COP or CoW. In some embodiments, diffusion barrier layer 143 has a thickness in a range from about 5 Å to about 1000 Å.

In some embodiments, polymer material 146 is benzocyclobutene (BCB) polymer, polyimide (PI), or polybenzoxazole (PBO). In some embodiments, polymer material 146 is made of benzocyclobutene (BCB) polymer and is applied to metallization structure 122 by spin coating. Since benzocyclobutene polymer is a soft material, it can tolerant more stress resulting from the TSV formed in the subsequent processes, compared to other dielectric materials such as silicon dioxide.

As shown in FIG. 1A, semiconductor wafer 200 is similar to semiconductor wafer 100. Semiconductor wafer 200 includes a substrate 204 and device regions 203. Substrate 204 is similar to substrate 104. Device regions 203 are similar to device regions 103 and include a gate structure 209, source/drain regions 210, and isolation structures 212. Gate structure 209 is similar to gate structure 109 and includes a gate dielectric layer 206, a gate electrode 208, and possibly spacers (not shown). Gate dielectric layer 206 is similar to gate dielectric layer 106, and gate electrode 208 is similar to gate electrode 108. In addition, source/drain regions 210 in devices 203 are similar to source/drain regions 110, and isolation structures 212 in devices 203 are similar to isolation structures 112.

Semiconductor wafer 200 further includes a metallization structure 222 and a bonding structure 242. Metallization structure 222 is similar to metallization structure 122 and includes a contact plug 214 embedded in a dielectric layer 207 and conductive features 224 embedded in an insulating material 226. Contact plug 214 is similar to contact plug 114, and dielectric layer 207 is similar to dielectric layer 107. Conductive features 224 are similar to conductive features 124, and insulating material 226 is similar to insulating material 126. Bonding structure 242 is similar to bonding structure 142 and includes a conductive material 244 and a polymer material 246. Conductive material 244 is similar to conductive material 144, and polymer material 246 is similar to polymer material 146. Metallization structure 222 may further include a diffusion barrier layer 243 which is similar to diffusion barrier layer 143.

Before semiconductor wafer 100 is bonded to semiconductor 200, semiconductor wafers 100 and 200 are aligned, such that conductive material 144 on semiconductor wafer 100 can be bonded to conductive material 244 on semiconductor wafer 200 and polymer material 146 on semiconductor wafer 100 can be bonded to polymer material 246 on semiconductor wafer 200. In some embodiments, the alignment of semiconductor wafers 100 and 200 may be achieved by using an optical sensing method.

Figure 1B:
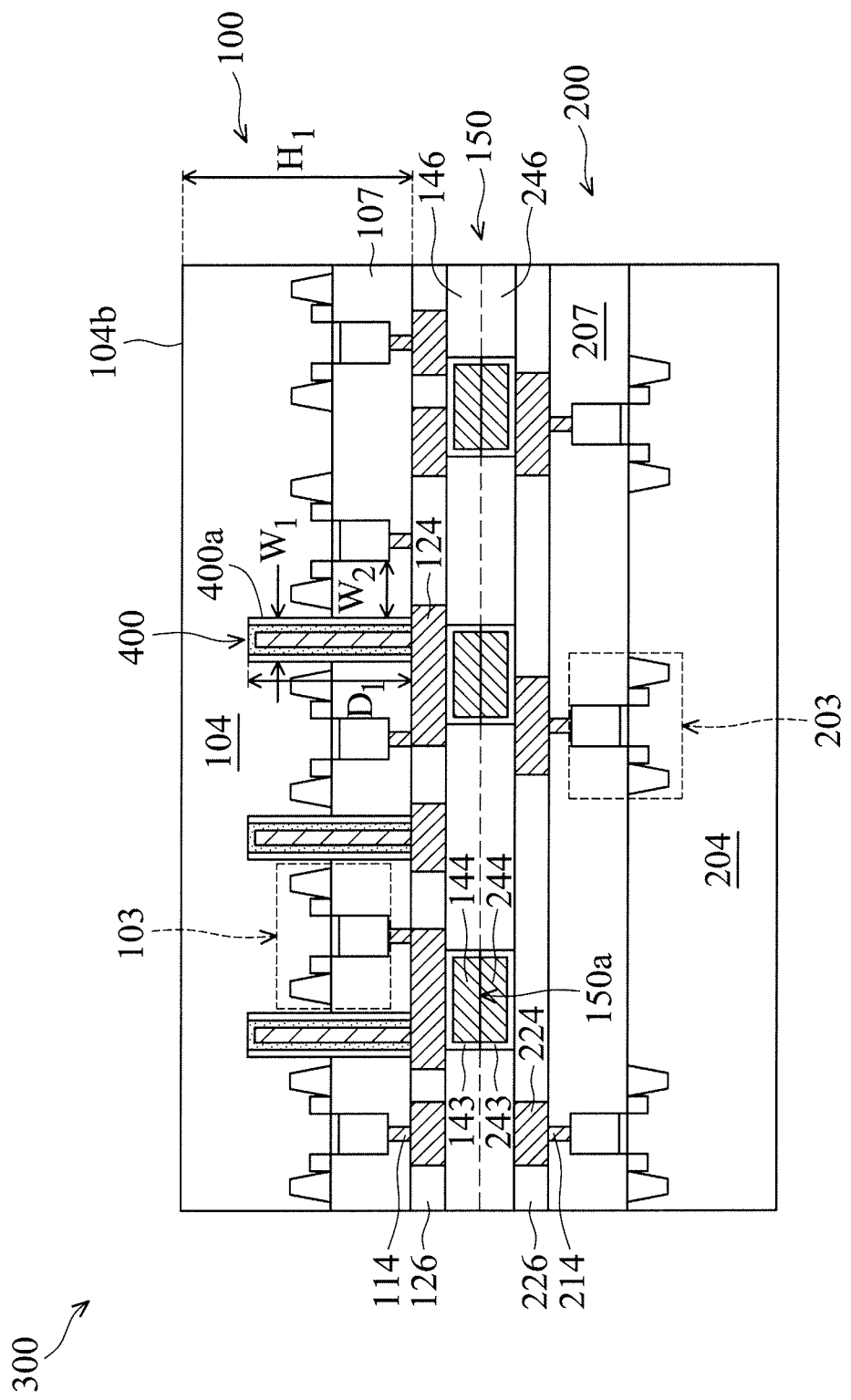

Referring to FIG. 1B, after the alignment is performed, semiconductor wafers 100 and 200 are bonded together by hybrid bonding to form a 3DIC stacking structure 300 (die stack). Semiconductor wafers 100 and 200 are hybrid bonded together by the application of pressure and heat. In some embodiments, during hybrid bonding, stacking structure 300 is heated to a temperature in a range from about 100° C. to about 200° C., such that polymer materials 146 and 246 become a non-confined viscous liquid and are reflowed. By reflowing polymer materials 146 and 246, voids therein are eliminated.

Afterwards, stacking structure 300 is further heated to a higher temperature in a range from about 220° C. to about 380° C., such that conductive materials 144 and 244 are interconnected by thermocompression bonding and polymer materials 146 and 246 are fully cured. In some embodiments, the pressure for hybrid bonding is in a range from about 0.7 bar to about 10 bar. The hybrid bonding process may be performed in an inert environment, such as an environment filled with inert gas including $N_2$, Ar, He, or combinations thereof.

As shown in FIG. 1B, hybrid bonding involves at least two types of bondings, including metal-to-metal bonding and non-metal-to-non-metal bonding. As shown in FIG. 1B, a hybrid bonding structure 150 is formed between semiconductor wafers 100 and 200. Hybrid bonding structure 150 includes conductive materials 144 and 244 bonded by metal-to-metal bonding and polymer materials 146 and 246 bonded by non-metal-to-non-metal bonding. As shown in FIG. 1B, bonding structure 150 has a metallic bonding interface 150a between conductive materials 144 and 244 but may not have a clear non-metallic interface between polymer materials 146 and 246 due to the reflowing process.

Compared to hybrid bonding involving other dielectric layers, semiconductor wafers 100 and 200 are bonded through polymer materials 146 and 246. Since the bonding of polymer materials 146 and 246 involves the reflowing of polymer materials 146 and 246, voids in polymer materials 146 and 246 are eliminated and bonding strength of semiconductor wafers 100 and 200 is improved.

Figure 1C:
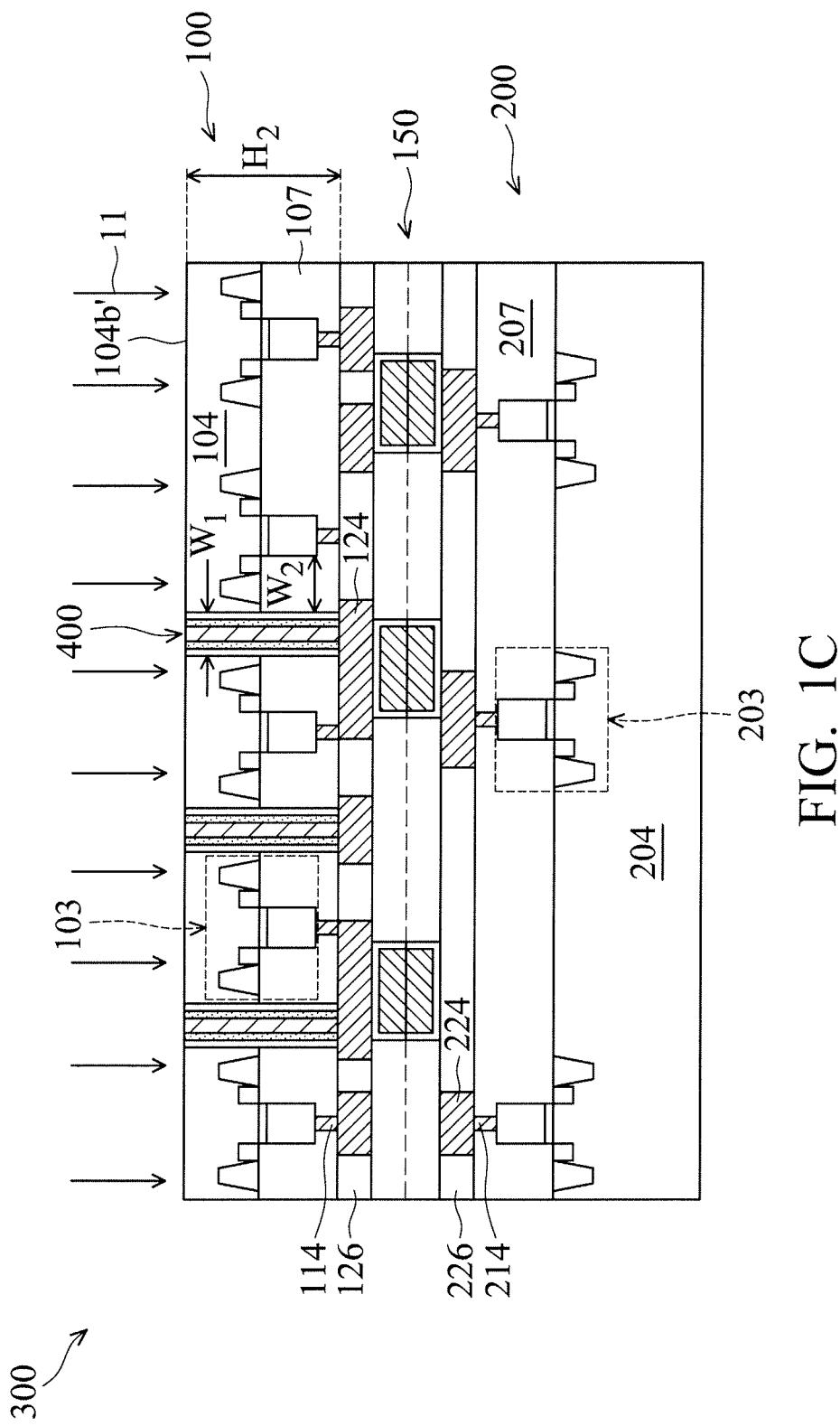

Referring to FIG. 1C, after hybrid bonding, stacking structure 300 is put on a tape (not shown) and a thinning process 11 is performed on a bottom surface 104b of semiconductor wafer 100. After thinning process 11, TSVs 400 are exposed. Thinning process 11 may include a grinding operation and a polishing operation (such as chemical mechanical polishing (CMP)). After thinning process 11, a wet etching operation is performed to remove the defects formed on bottom surface 104b' of semiconductor wafer 100. In some embodiments, bottom portion of diffusion barrier layer 420 is removed to expose conductive material 430 by thinning process 11. Therefore, after thinning process 11, height $H_2$ is smaller than depth $D_1$. In some embodiments, TSVs 400 have an aspect ratio ($H_2/W_2$) in a range from about 2 to about 15. In some other embodiments, height $H_2$ is equal to depth $D_1$. After thinning process 11, semiconductor wafer 100 has a height $H_2$ from bottom surface 104b of semiconductor substrate 104 to a top surface of gate structure 109 in a range from about 0.2 μm to about 10 μm. Height $H_2$ is smaller than height $H_1$. In some embodiments, height $H_2$ is in a range from about 0.01 to about 0.99 of height $H_1$.

If thinning process 11 is performed before semiconductor wafers 100 and 200 are bonded, the thin semiconductor wafer 100 is easy to break during subsequent processes. However, if semiconductor wafers 100 and 200 are bonded firstly, as shown in FIG. 1C, such bonding enables the thinning of semiconductor wafer 100. As a result, semiconductor wafer 100 could be thinned to a relatively smaller height $H_2$ compared to semiconductor wafer 100 is directly thinned before bonding.

Figure 1D:
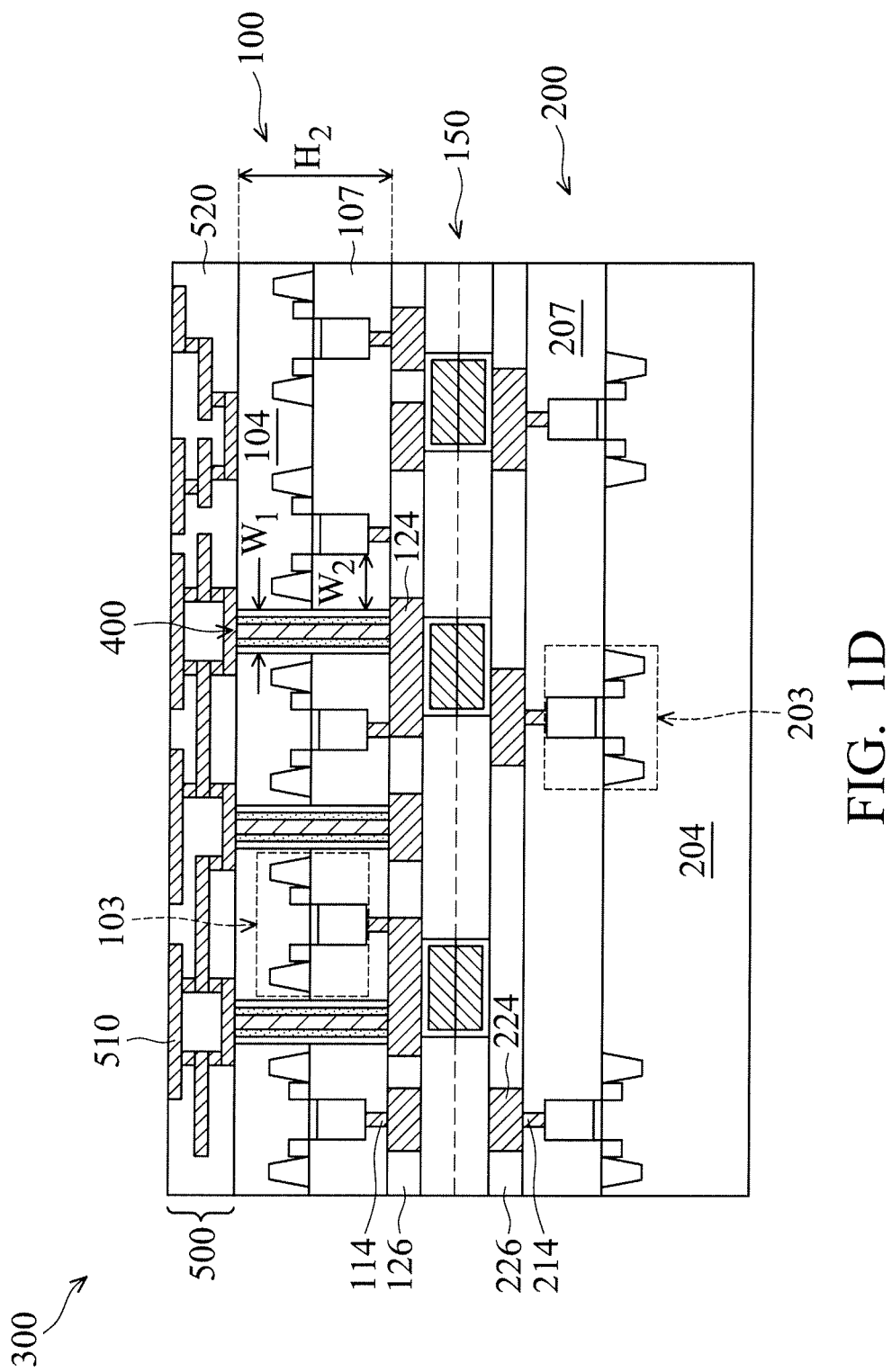

Referring to FIG. 1D, an interconnect structure 500 is formed on bottom surface 104b of semiconductor wafer 100. Interconnect structure 500 is electrically connected to conductive features 124 over substrate 104 via TSVs 400. Interconnect structure 500 includes conductive features 510, such as conductive lines, vias, or conductive pads, formed in an insulating material 520. The metal routing of the conductive features shown in FIG. 1D is merely an example. Alternatively, other metal routing designs of conductive features may be used according to actual application.

After forming interconnect structure 500, one or more redistribution layers (RDLs) (not shown) may be formed over interconnect structure 500. For example, redistribution layers (RDLs) are embedded in a passivation layer. Interconnect structure 500, redistribution layers (RDLs) and TSVs 400 provide electrical interconnection. In addition, since TSVs 400 have a relatively low resistance, RC delay is reduced.

In addition, other processes may also be performed to 3DIC stacking structure 300, and 3DIC stacking structure 300 may be diced to form individual chips afterwards.

Figure 2A:
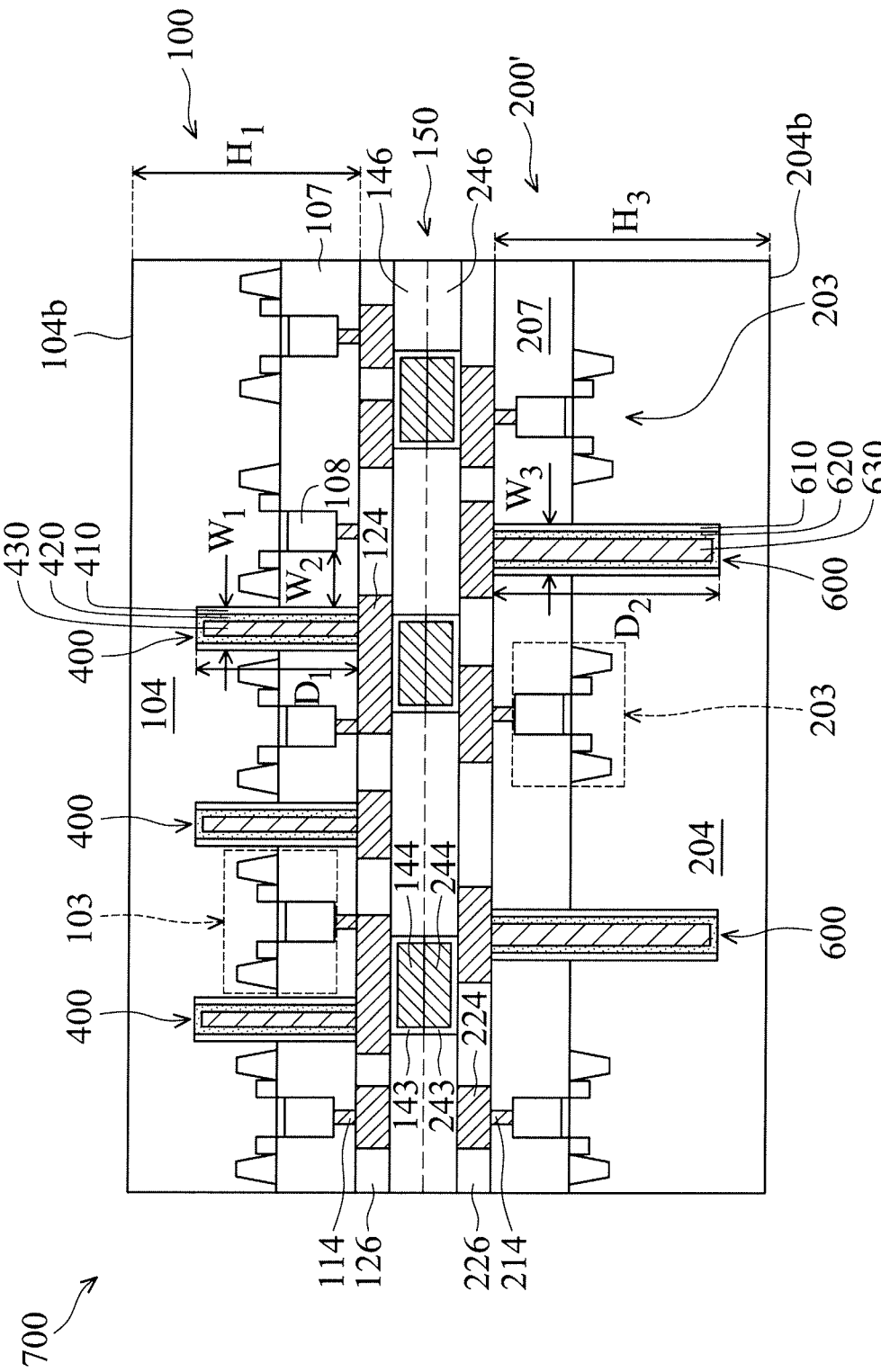
FIGS. 2A-2D show cross-sectional representations of various stages of forming a semiconductor device, in accordance with some embodiments of the disclosure.

FIGS. 2A-2D show cross-sectional schematic representations of various stages of forming a semiconductor device in accordance with some embodiments. Referring to FIG. 2A, a 3DIC stacking structure 700 is formed by bonding semiconductor wafers 100 and 200. As shown in FIG. 2A, semiconductor wafer 200' is almost the same with semiconductor wafer 200 except that TSVs 600 are formed in semiconductor wafer 200'. In some embodiments, TSVs 400 have a diameter different from that of TSVs 600. In some embodiments, the formation of TSVs 600 involves additional patterning and etching processes. In some embodiments, number of the TSVs 400 is larger than that of TSVs 600. In some other embodiments, number of the TSVs 400 is smaller than that of TSVs 600.

As shown in FIG. 2A, each TSVs 600 includes liner 610, which is similar to liner 410, diffusion barrier layer 620, which is similar to diffusion layer 420, and conductive material 630, which is similar to conductive material 430. TSVs 600 extend to metal pad 224 of semiconductor wafer 200.

Because semiconductor wafer 200 will be thinned later to expose TSVs 600, TSVs 600 do not extend through the whole substrate 204 of semiconductor wafer 200. Therefore, TSVs 600 are designed to have a depth $D_2$ which is smaller than original height $H_3$ of semiconductor wafer 100.

In some embodiments, semiconductor wafer 200 has a height $H_3$ from a bottom surface 204b of semiconductor substrate 204 to a top surface of gate structure 209 in a range from about 17 μm to about 100 μm. In some embodiments, TSVs 600 have a width $W_3$ in a range from about 0.3 μm to about 10 μm. In some embodiments, TSVs 600 have a depth $D_2$ in a range from about 15 μm to about 100 μm. In some embodiments, TSVs 600 have an aspect ratio ($D_2/W_3$) in a range from about 5 to about 15. In some embodiments, depth $D_1$ is the same as depth $D_2$. In some other embodiments, depth $D_1$ is different with depth $D_2$.

Figure 2B:
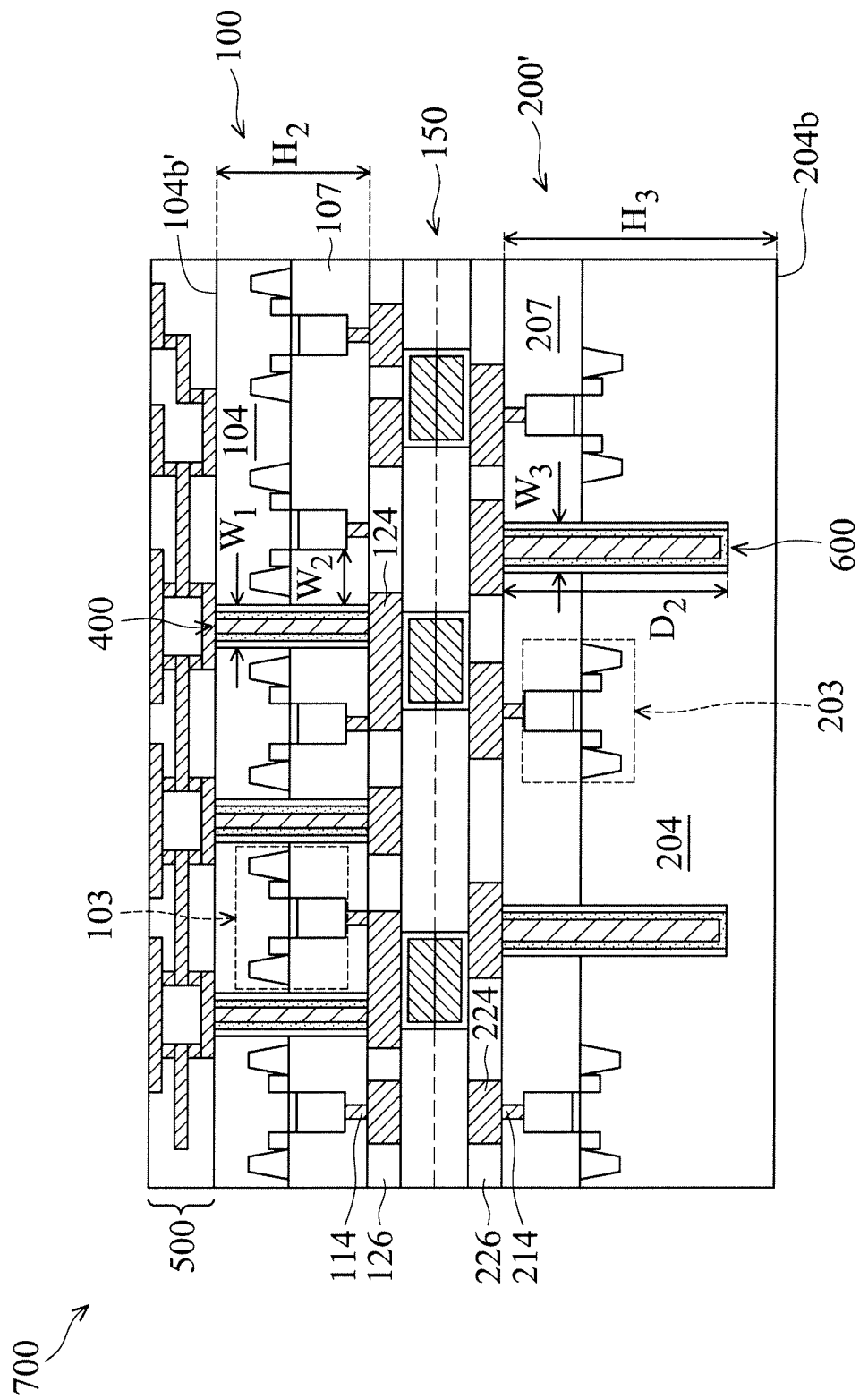

Referring to FIG. 2B, semiconductor wafer 100 is thinned to height $H_2$ and interconnect structure 500 is formed on bottom surface 104*b* of semiconductor wafer 100. Interconnect structure 500 is similar to interconnect structure 500 in FIG. 1D, and detail description of interconnect structure 500' will not be repeated again for brevity.

Figure 2C:
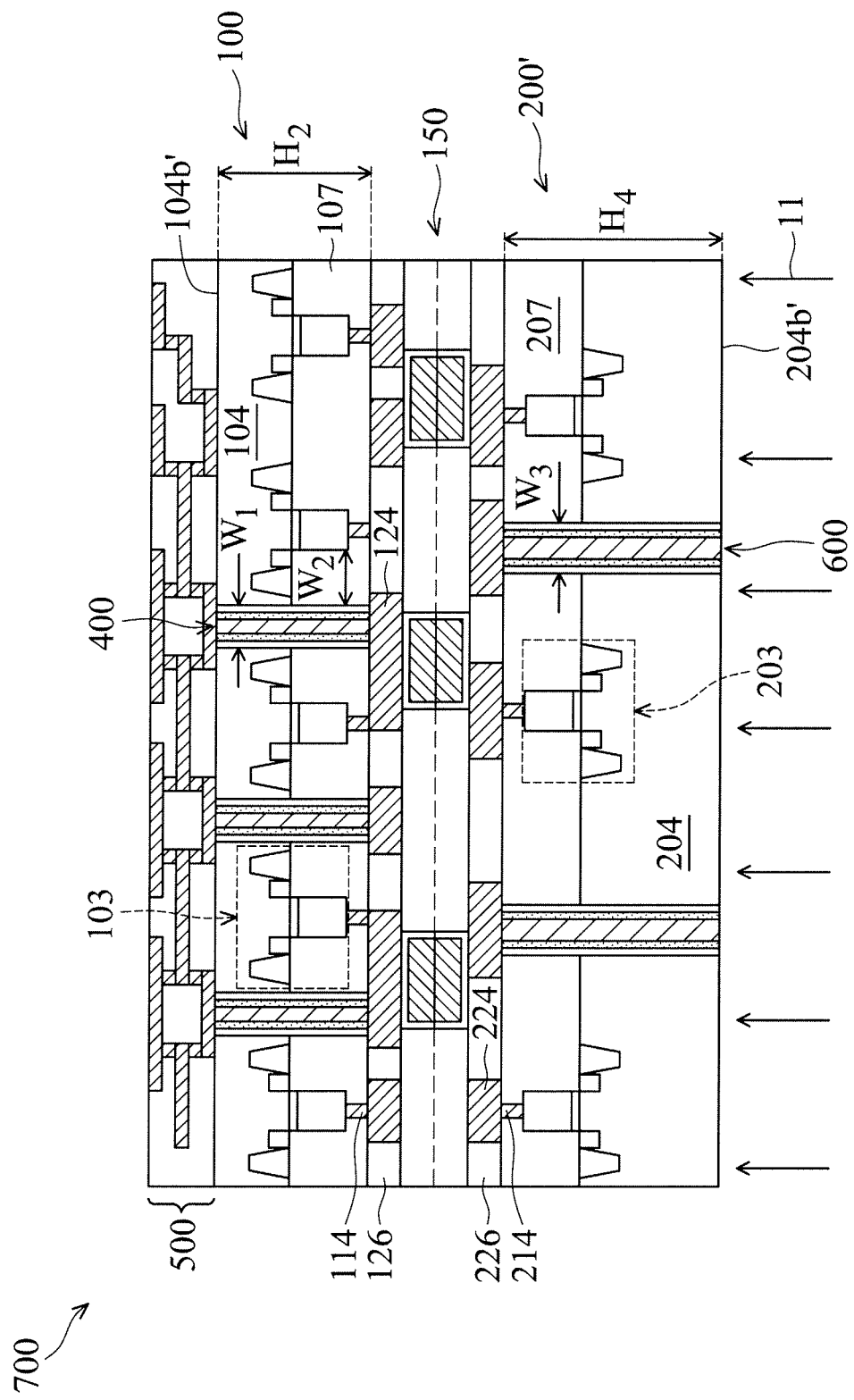

Referring to FIG. 2C, after forming interconnect structure 500, stacking structure 700 is put on a tape and a thinning process 11 is performed on a bottom surface 204*b* of semiconductor wafer 200. After thinning process 11, TSVs 600 are exposed. Thinning process 11 is described above and will not be repeated for brevity. After thinning process 11, semiconductor wafer 100 has a height $H_4$ from bottom surface 204*b'* of semiconductor substrate 204 to a top surface of gate structure 109 in a range from about 15 µm to about 100 µm. Height $H_4$ is smaller than height $H_3$. In some embodiments, height $H_4$ is equal to or smaller than depth $D_2$.

Figure 2D:
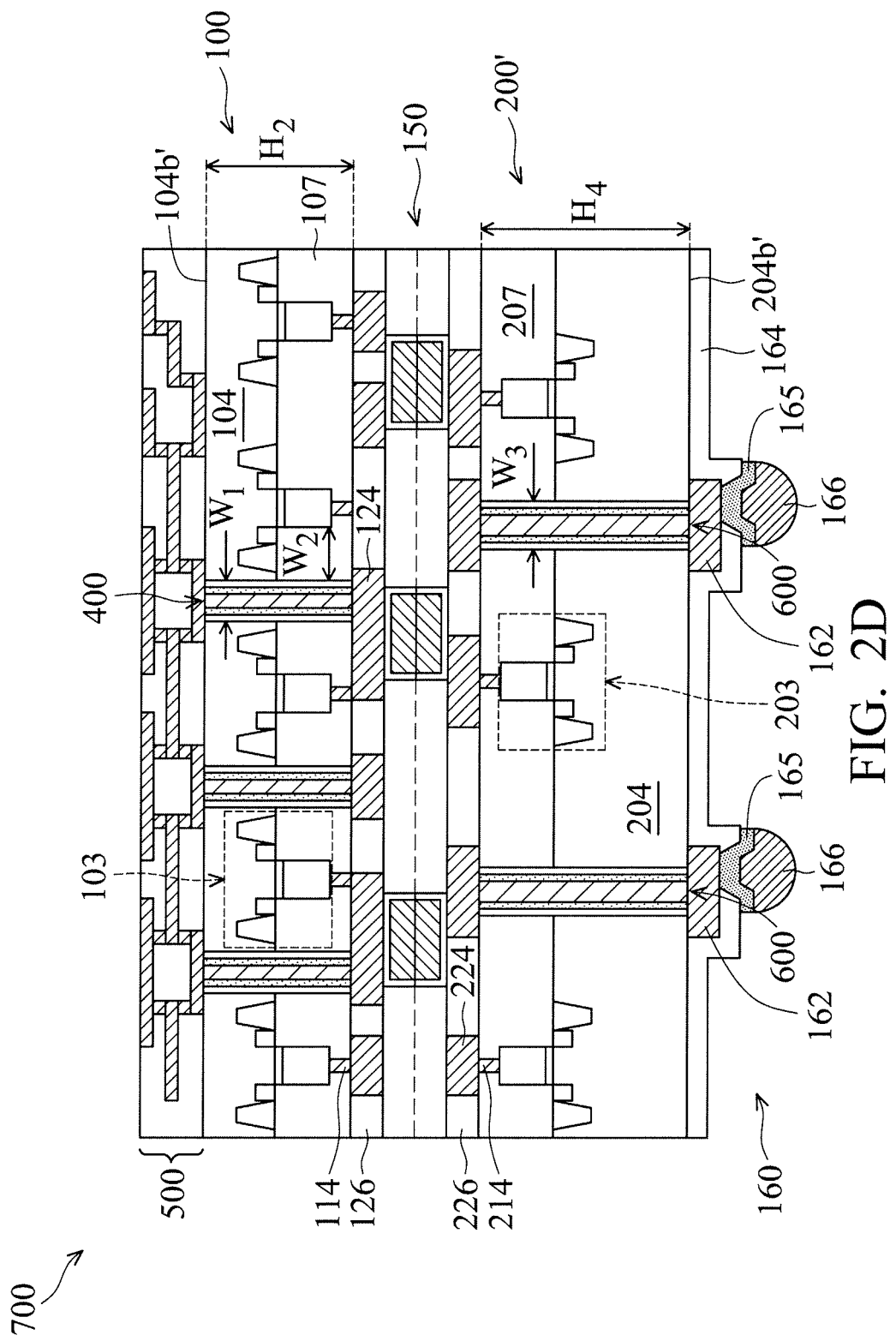

Referring to FIG. 2D, redistribution (RDL) structure 160 is formed on bottom surface 104*b* of substrate 104. RDL structure 160 include a metal pad 162 formed in a passivation layer 164. Metal pad 162 is electrically connected to exposed TSVs 600. Metal pad 162 is made of conductive materials with low resistivity, such as copper (Cu), aluminum (Al), Cu alloys, Al alloys, or other applicable materials. Although FIG. 2D only shows one RDL structure 160, more than one RDL structures may be formed.

An under bump metallization (UBM) layer 165 is formed on metal pad 162, and conductive element 166 (such as solder ball) is formed over UBM layer 165. UBM layer 165 may contain an adhesion layer and/or a wetting layer. In some embodiments, UBM layer 165 is made of titanium (Ti), titanium nitride (TiN), tantalum nitride (TaN), tantalum (Ta), or the like. In some embodiments, UBM layer 165 further includes a copper seed layer. In some embodiments, conductive element 166 is made of conductive materials with low resistivity, such as solder or solder alloy. Exemplary elements included in the solder alloy include Sn, Pb, Ag, Cu, Ni, Bi or combinations thereof.

Interconnect structure 500' is electrically connected to another package (not shown) on the backside of semiconductor wafer 200 via TSVs 600, RDL structure 160 and conductive element 166.

TSVs 400 and 600 individually provide different functions. Semiconductor wafer 100 is electrically connected to another package structure (not shown) via interconnect structure 500 and TSVs 400. Semiconductor wafer 200 is electrically connected to another package structure (not shown) via interconnect structure 500' and TSVs 600. TSVs 400 and 600 provide a fast conductive path to connect semiconductor wafer 100, semiconductor wafer 200, and/or other package structures, without the formation of complicated metal routings.

Embodiments of mechanisms for forming a die stack are provided. Two semiconductor wafers are bonded together by hybrid bonding with metal-to-meal bonding and polymer-to-polymer bonding to form the die stack. TSVs are formed before the two semiconductor wafers are bonded. One or both of the semiconductor wafers are thinned to expose the TSVs after the semiconductor wafers are bonded. The bonded semiconductor wafers provides extra strength to reduce the risk of wafer breaking during a thinning process. In addition, polymer-to-polymer bonding is strong, and the polymer material is soft to provide a cushion to absorb the stress resulting from the TSVs.

In some embodiments, a semiconductor device structure is provided. The semiconductor device includes a bonding structure formed between a first substrate and a second substrate. The bonding structure includes a first polymer bonded to a second polymer, and a first conductive material bonded to a second conductive material. The semiconductor device includes a first TSV formed in the first substrate and an interconnect structure formed over the first TSV. The first TSV is between the interconnect structure and the bonding structure.

In some embodiments, a semiconductor device structure is provided. The semiconductor device includes a first metallization structure formed over a first substrate and a first bonding structure formed over the first metallization structure. The first bonding structure includes a first conductive material embedded in a first polymer material and a second bonding structure formed over a second substrate. The second bonding structure includes a second conductive material embedded in a second polymer material, the first conductive material is bonded to the second conductive material and the first polymer material is bonded to the second polymer material. The semiconductor device includes a first through substrate via (TSV) extending from a bottom surface of the first substrate to the first metallization structure, and the first metallization structure is between the first TSV and the first polymer material.

In some embodiments, a semiconductor device structure is provided. The semiconductor device includes a first substrate bonded to a second substrate via a bonding structure, and the bonding structure includes a first polymer bonded to a second polymer, and a first diffusion barrier layer bonded to a second diffusion barrier layer. The semiconductor device also includes a first TSV extending from a bottom surface of the first substrate to a first metallization structure and a second TSV extending from a bottom surface of the second substrate to a second metallization structure over the second substrate. The second metallization structure is between the second diffusion barrier layer and the second TSV.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
a bonding structure formed between a first substrate and a second substrate, wherein the bonding structure comprises a first polymer bonded to a second polymer, and a first conductive material bonded to a second conductive material;
a first TSV formed in the first substrate;
an interconnect structure formed over the first TSV, wherein the first TSV is between the interconnect structure and the bonding structure; and
a first conductive layer between the first conductive material and the first TSV, wherein the first conductive layer has a first surface and a second surface, the first surface is in direct contact with the first TSV, and the second surface is in direct contact with the first polymer.

2. The semiconductor device structure as claimed in claim 1, further comprising:
a first transistor formed over the first substrate; and
a first contact plug formed over the first transistor, wherein the first conductive layer is in direct contact with the first TSV and the first contact plug.

3. The semiconductor device structure as claimed in claim 1, wherein the first polymer material and the second polymer material are respectively made of benzocyclobutene (BCB) polymer, polyimide (PI), or polybenzoxazole (PBO).

4. The semiconductor device structure as claimed in claim 1, wherein the first substrate has a first height, and the second substrate has a second height, and the first height is smaller than the second height.

5. The semiconductor device structure as claimed in claim 1, further comprising:
a first diffusion barrier layer formed in the first polymer material,
wherein the first conductive layer is between the first diffusion barrier layer and the first TSV.

6. The semiconductor device structure as claimed in claim 1, further comprising:
a second TSV extending from a bottom surface of the second substrate to a second metallization structure over the second substrate.

7. A semiconductor device structure, comprising:
a first metallization structure formed over a first substrate;
a first bonding structure formed over the first metallization structure, wherein the first bonding structure comprises a first conductive material embedded in a first polymer material;
a second bonding structure formed over a second substrate, wherein the second bonding structure comprises a second conductive material embedded in a second polymer material, the first conductive material is bonded to the second conductive material and the first polymer material is bonded to the second polymer material;
a first through substrate via (TSV) extending from a bottom surface of the first substrate to the first metallization structure, wherein the first metallization structure is between the first TSV and the first polymer material;
a first transistor formed over the first substrate; and
a first contact plug formed over the first transistor, wherein the first metallization structure is in direct contact with the first TSV and the first contact plug.

8. The semiconductor device structure as claimed in claim 7, further comprising:
a second TSV extending from a bottom surface of the second substrate to a second metallization structure over the second substrate.

9. The semiconductor device structure as claimed in claim 8, wherein a first width of the first TSV is smaller than a second width of the second TSV.

10. The semiconductor device structure as claimed in claim 7, further comprising:
an interconnect structure formed over the bottom surface of the first substrate, wherein the interconnect structure is in direct contact with the first TSV.

11. The semiconductor device structure as claimed in claim 7, wherein the first polymer material and the second polymer material are respectively made of benzocyclobutene (BCB) polymer, polyimide (PI), or polybenzoxazole (PBO).

12. The semiconductor device structure as claimed in claim 7, further comprising:
a first diffusion barrier layer formed in the first polymer material, wherein the first metallization structure is between the first diffusion barrier layer and the first TSV.

13. The semiconductor device structure as claimed in claim 7, wherein the first substrate has a first height, and the second substrate has a second height, and the first height is smaller than the second height.

14. A semiconductor device structure, comprising:
a first substrate bonded to a second substrate via a bonding structure, wherein the bonding structure comprises a first polymer bonded to a second polymer, and a first diffusion barrier layer bonded to a second diffusion barrier layer;
a first TSV extending from a bottom surface of the first substrate to a first conductive layer;
a first contact plug adjacent to the first TSV, wherein the first conductive layer is in direct contact with the first TSV and the first contact plug; and
a second TSV extending from a bottom surface of the second substrate to a second conductive layer over the second substrate, wherein the second conductive layer is between the second diffusion barrier layer and the second TSV.

15. The semiconductor device structure as claimed in claim 14, further comprising:
a first transistor formed over the first substrate; and
the first contact plug formed over the first transistor.

16. The semiconductor device structure as claimed in claim 14, further comprising:
an interconnect structure formed over the bottom surface of the first substrate, wherein the interconnect structure is in direct contact with the first TSV.

17. The semiconductor device structure as claimed in claim 14, wherein the first substrate has a first height, and the second substrate has a second height, and the first height is smaller than the second height.

18. The semiconductor device structure as claimed in claim 14, wherein a first width of the first TSV is smaller than a second width of the second TSV.

19. The semiconductor device structure as claimed in claim 1, further comprising:
a second transistor formed over the second substrate;
a second contact plug formed over the second transistor; and
a second conductive layer formed over the second contact plug, wherein the second conductive layer has a first surface and a second surface, the first surface is in direct contact with the second contact plug, and the second surface is in direct contact with the second polymer.

20. The semiconductor device structure as claimed in claim 14, wherein the first conductive layer has a first surface in contact with the first contact plug and a second surface in contact with the first polymer.

* * * * *